United States Patent [19]

Scifres et al.

[11] Patent Number: 4,815,084
[45] Date of Patent: Mar. 21, 1989

[54] SEMICONDUCTOR LASER WITH INTEGRATED OPTICAL ELEMENTS

[75] Inventors: Donald R. Scifres, San Jose; William Streifer, Palo Alto, both of Calif.

[73] Assignee: Spectra Diode Laboratories, Inc., San Jose, Calif.

[21] Appl. No.: 53,092

[22] Filed: May 20, 1987

[51] Int. Cl.[4] .................................................. H01S 3/19
[52] U.S. Cl. ........................................ 372/46; 372/44; 372/45; 372/50; 350/96.12
[58] Field of Search .................................... 372/43–46, 372/50; 350/96.12

[56] References Cited

U.S. PATENT DOCUMENTS 4,367,916  1/1983  Mottier et al. ................... 350/96.12
4,445,759  5/1984  Valette ............................ 350/96.12

OTHER PUBLICATIONS

Yenezu et al., "High Optical Power Density Emission From A Window Stripe" AlGaAs Double-Heterostructure Laser, Appl. Phys Lett., 34(10), May 15, 1979, pp. 637–638.
Burnham et al., "Traverse Mode Filtering", Xerox Disclosure Journal, vol. 4, No. 3, May/Jun. 1979, p. 367.
Mukai et al., Applied Physics Letters, vol. 47, No. 3, Aug. 1, 1985, pp. 188–190; "Monolithic Integration of a Lens Inside a Diode-Laser Cavity for Beam Convergence".
Salzman et al., Applied Physics Letters, vol. 46, No. 3, Feb. 1, 1985, pp. 218–220; "Unstable Resonator Cavity Semiconductor Lasers".

Primary Examiner—William L. Sikes
Assistant Examiner—Georgia Y. Epps
Attorney, Agent, or Firm—Thomas Schneck

[57] ABSTRACT

Lasers and laser arrays having various optical elements, such as lenses, apertures, prisms, etalons and phase plates, integrated within the resonant optical cavity of the laser. The optical elements are created by introducing a lateral geometric contour in boundaries of refractive index changes thereby causing a change in shape of phase fronts of lightwaves propagating in the laser cavity in a manner analogous to optical elements. Boundaries may be defined between an active region and transparent window regions or may be formed in other layers with which lightwaves interact, such as the layers bounding the active region. Curved boundaries produce convergent or divergent lenses. Absorbing regions may bound window regions to produce apertures for lateral mode control. A periodic step shaped boundary can be used to shift the phase of lightwaves propagating in some laser array waveguides relative to lightwaves in others of the waveguides in order to cause beam emission of a desired supermode. Fresnel lenses, prisms and etalons can also be integrated within the laser.

45 Claims, 3 Drawing Sheets

SEMICONDUCTOR LASER WITH INTEGRATED OPTICAL ELEMENTS

DESCRIPTION

1. Technical Field

The present invention relates to semiconductor lasers and laser arrays and in particular to lasers with associated optical elements for modifying one or more characteristics of the beam output.

1. Background Art

The combination of lasers with passive optical components is widely used to modify one or more characteristics of the laser beam. For instance, lenses, polarizers, filters, beam expanders, collimators, beam splitters, mirrors and the like are often used outside of the laser cavity. Fiberoptic waveguides are coupled to semiconductor lasers to transmit the beam output to another location. In gas lasers, passive optical components such as gratings, prisms, Brewster-angle windows, lenses and the like may be placed inside of the laser cavity. However, optical components which have been integrated inside the optical cavity of semiconductor lasers and laser arrays are very limited. For example, cleaved end facets of a semiconductor laser form reflectors which define a Fabry-Perot laser cavity. A periodic grating etched in a semiconductor layer provides distributed feedback in some lasers, and waveguide structures are usually provided in semiconductor lasers and laser arrays to provide lateral and transverse waveguiding in the active region of the laser for obtaining a desired output beam. Transparent window regions have been integrated in ends of lasers within a Fabry-Perot laser cavity to reduce the possibility of damage to the mirror facets, or to provide a region for diffraction coupling of light from neighboring waveguides of an array. The boundary between the pumped or active gain region of the laser and a window region is a plane substantially parallel to the cavity mirrors. The small index of refraction difference at the boundary produces a mechanism for light reflection, but the amount of reflection is negligible as far as laser operation is concerned In an article in Applied Physics Letters, vol. 47, no. 3, Aug. 1, 1985, pp. 188-190, Mukai et al. disclose a diode laser in which a lens is monolithically integrated. The lens is formed in one end of a mesa-stripe laser by laterally varying the thickness of the upper cladding layer. The thickness variation causes the equivalent refractive index to be lower toward the edges of the mesa so that the phase front of a proper mode of the waveguide part of the laser is distorted. It is shown that a laterally converging laser beam outside the laser cavity is realized. Mukai et al. also suggest that lasers with output beam convergence in both lateral and transverse directions can be realized by introducing a multilayer structure into a window part of a window structure laser, thereby profiling the refractive index of the window in the transverse direction during growth.

In an article in Applied Physics Letters, vol. 46, no. 3, Feb. 1, 1985, pp. 218-220, J. Salzman et al. disclose a semiconductor laser with both mirror facets etched to concave surfaces with no planar feedback in any part of the cavity. Standard photolithographic techniques were used to form resist patterns on top of double heterostructure wafers with the shape of the desired mirrors. These patterns were then etched either in an etchant solution or with a reactive ion etching technique. The resulting unstable resonator cavity produced a stable, highly coherent lateral mode output and a single longitudinal mode up to an injection current of about twice the threshold current. A primary limitation for producing lasers with a confocal unstable resonator is the etching of both mirrors with high quality curved surfaces.

In U.S. Pat. No. 4,367,916, Mottier et al. disclose phase displaced and absorption Fresnel lenses for integrated optics comprising a number of overlayers deposited on the surface of a waveguide propagating a wave. The overlayers are placed symmetrically about the optical axis of the lens at specified distances from the axis and with specified thicknesses. In the case of phase displaced lenses, the overlayers have a thickness greater than the depth of penetration of the evanescent wave in the overlayers and have lengths producing a phase displacement of 180 degrees. In the case of absorption lenses, the overlayers are absorptive material having a length for which the wave guided under the overlayer is entirely absorbed.

It is often difficult to obtain a desired lateral radiation pattern from a broad area or phased array semiconductor laser. Broad area lasers tend to undergo filamentation, giving rise to a nonuniform and unstable near field optical distribution in the plane of the p-n junction. A multistripe phased array laser often locks in the highest supermode which radiates in twin lobes rather than the more desirable first supermode radiating in a single lobe. Operation of the higher order supermode limits the utility of these devices in applications requiring diffraction limited optics. Integrating optical components inside a laser cavity would add much to freedom in designing lasers with stable desired characteristics. However, integrating such optical elements has been limited so far, because adjusting the shape of the optical phase front in a semiconductor laser cavity and the presence of the optical elements themselves in the semiconductor body may cause deterioration of laser characteristics.

An object of the present invention is to produce semiconductor lasers and laser arrays with integrated optical elements in the laser structure without deterioration of desired laser beam characteristics.

Another object of the present invention is to produce semiconductor lasers and laser arrays with high power output and stable controlled radiation patterns.

DISCLOSURE OF THE INVENTION

The above objects have been met with semiconductor lasers and laser arrays in which lenses and other optical elements have been integrated into the semiconductor bodies of the lasers by means of refractive index changes at interfaces or boundaries in the traverse optical waveguide in which lightwaves propagate, hereafter called the light guiding region, the boundaries being characterized by a lateral geometric contour corresponding to surfaces of selected optical elements. In other words, the interface or boundary has been variously shaped and oriented to produce changes in shape of phase fronts of lightwaves propagating across the boundaries in a manner analogous to lenses, phase plates and other optical elements within the laser. One way these boundaries may be created is by the refractive index change that occurs between pumped gain regions and transparent window regions in the cavity. Alternatively, such optical elements may be accomplished via refractive index changes in any layer in which the propagating lightwave interacts, such as in one or more of the layers bounding the active region. It has been discovered that the refractive index changes at shaped boundaries do not adversely cause deterioration of desired lasing characteristics, such as gain and beam pattern stability, and in some embodiments improve these characteristics.

The lasers comprise a plurality of contiguous semiconductor layers forming a semiconductor body, portions of at least one of the layers forming an active region for lightwave generation. Such layers also form the light guiding region wherein light propagates via total internal reflection. Layers forming the light guiding region are hereafter called light guiding layers. Metallic contact stripes or other means inject current into the active region to produce the lightwaves and optical feedback means associated with the layers, such as reflective end facets or distributed feedback gratings, define a resonant optical cavity including the active region. The laser may also include transparent window regions which have a higher bandgap and lower effective index of refraction than the active region, and may be defined by a thickness difference in one of the layers, a step in the layer or layers forming the active region, an impurity implant, impurity induced disordering from diffusion of the implanted impurity across the layers forming the active region or by a charge distribution from patterned contact stripes. In any case, at least one boundary is thereby defined with a refractive index change at the boundary with which lightwaves in the light guiding region interact At least portions of these boundaries have a shape and orientation or lateral geometric contour corresponding to a surface of a selected optical element thereby causing a change in the shape of phase fronts of the lightwaves propagating in the optical cavity across the boundaries that mimics the change obtained by the optical element. Shaped index changes can also be formed in any of the layers comprising the light guiding region within which light propagates, such as the layers immediately above and below the active region.

In this manner, various optical components, such as diverging lenses, converging or diverging Fresnel lenses, etalons, prisms, apertures and the like, as well as combinations of these elements, are defined in the semiconductor body of the laser. Absorptive regions may bound a window region to define an aperture in the window region therebetween for lightwave propagation. In the case of laser arrays, a plurality of laterally spaced apart waveguides may be associated with the active region in the laser. The boundary portions may then have a periodic stepped shape so as to produce a phase shift, such as a 180 degree phase shift, in adjacent lateral portions of the laser, thereby producing an in-phase or other desired light output. With one or a combination of these integrated optical components, lasers and laser arrays can be constructed with greater mode volumes, higher power, enhanced mode control, improved beam stability, diffraction limited output, or other desired characteristics.

BEST MODE FOR CARRYING OUT THE INVENTION

Figure 1:
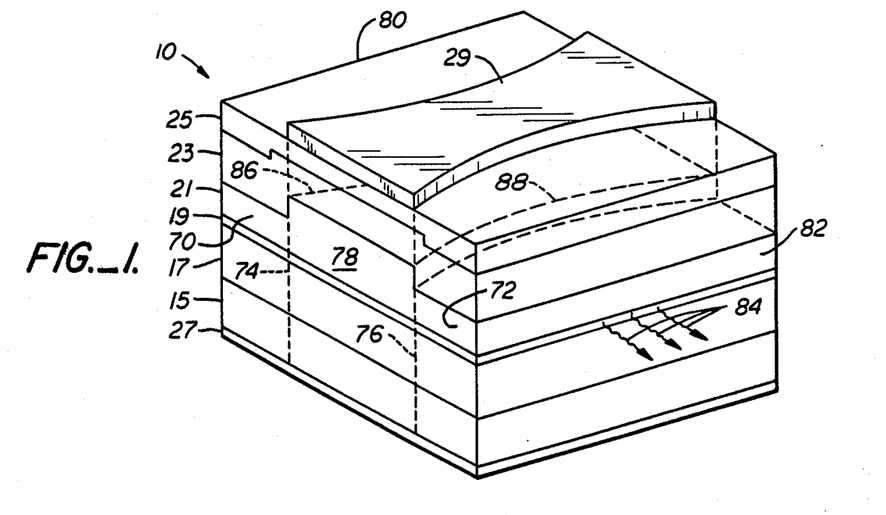
FIG. 1 is a perspective view of a first embodiment of a laser of the present invention.
Figure 2:
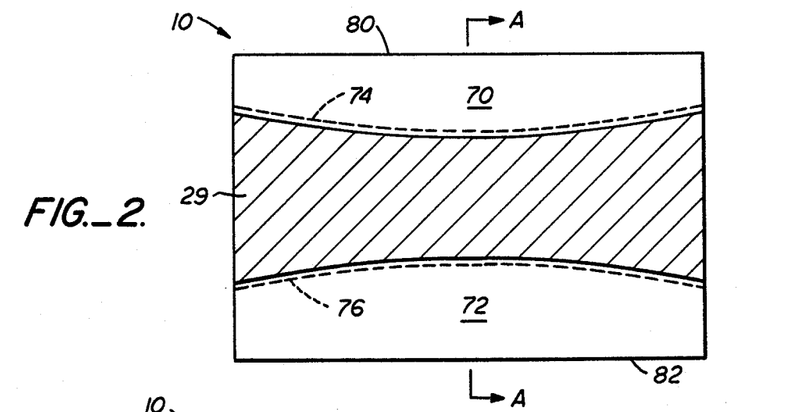
FIG. 2 is a top plan of the laser in FIG. 1.
Figure 3:
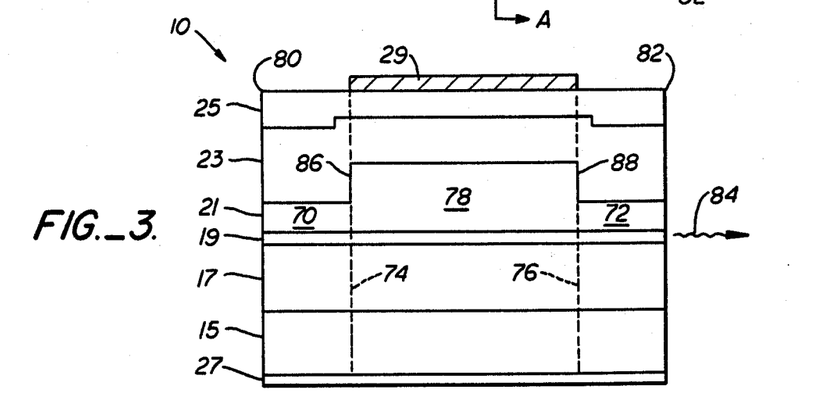
FIG. 3 is a side section of the laser in FIG. 2 taken along the line A—A and illustrating a first construction of window regions.

With reference to FIGS. 1–3, a semiconductor laser 10 of the present invention comprises a substrate 15 upon which are successively disposed layers 17, 19, 21, 23 and 25 of semiconductor material. Likewise, the laser 30 in FIG. 4 comprises a plurality of semiconductor layers 34, 36, 38, 40 and 42 which are successively disposed over a substrate 32, and the laser 50 in FIG. 5 comprises a plurality of semiconductor layers 54, 56, 58, 60 and 62 disposed over substrate 52. Thus each of the laser structures 10, 30 and 50 is made up of a plurality of contiguous semiconductor layers. The lasers are preferably fabricated on a wafer substrate by metal-organic chemical vapor deposition, but may also be fabricated by liquid phase epitaxy, molecular beam epitaxy or other known crystal growth processes.

Substrates 15, 32 and 52 are typically composed of n-GaAs. Cladding layers 17, 34 and 54 are typically composed of n-$Ga_{1-x}Al_xAs$, where x is usually in a range from about 0.3 to about 0.4 with a doping level in a range from $10^{17}$ to $4 \times 10^{18}$ cm$^{-3}$ (Se) and a thickness greater than 1.0 μm. First upper cladding layers 21, 38 and 58 are typically composed of p-$Ga_{1-y}Al_yAs$, where y is about 0.3 and the doping level is in a range from $10^{17}$ to $10^{18}$ cm$^{-3}$ (Mg) Second upper cladding layers 23, 40 and 60 are typically composed of p-$Ga_{1-z}Al_zAs$, where z is about 0.4 and the doping level is in a range from $10^{17}$ to $10^{19}$ cm$^{-3}$ (Mg) The combined thickness of the upper cladding layers 21 and 23, 38 and 40, and 58 and 60, is typically in a range from about 1.5 μm to about 2.0 μm. However, the individual thicknesses of the upper cladding layers, especially those of first upper cladding layers 21, 38 and 58, can vary laterally to produce a plurality of spaced apart waveguides, and can vary longitudinally, as seen in FIG. 3, to produce window regions, discussed further below. Typically, first upper cladding layers 21, 38 and 58 range in thickness from 0.25 μm to 0.5 μm. Second upper cladding layers 23, 40 and 60 are generally about 1.0 μm thick. Cap layers 25, 42 and 62 are typically composed of p-GaAs with a doping level of about $10^{19}$ cm$^{-3}$ (Zn) and a thickness of about 0.5 μm.

Composition variations are permissible. Also permissible are additional layers which are commonly found in semiconductor lasers, such as LOC, GRIN, twin guides and other layered waveguiding structures forming the light guiding region. Additionally, nonoptically interacting layers, such as buffer layers, etch stop layers, current blocking layers, contacting layers and the like, may be added to the laser.

Layers 19, 36 and 56 may or may not be intentionally doped and might consist of four 50 to 150 Å thick quantum wells of GaAs alternating with three 30 to 150 Å thick barriers of $Ga_{0.8}Al_{0.2}As$. Such quantum-well structures are known and described in an article by N. Holonyak, Jr. et al. entitled "Quantum-well Heterostructure Lasers" in IEEE Journal of Quantum Electronics, vol. QE-16, no. 2 (February, 1980), pp. 170–186. Alternatively, instead of a plurality of thin layers in a quantum-well or multiple-quantum-well heterostructure, layers 19, 36 and 56 may each comprise a single layer of $Ga_{1-w}Al_wAs$, where w is typically less than 0.1 micron. Portions of these layers 19, 36 and 56 form active regions, with the highest effective index of refraction and lowest bandgap, and pumped by current injection therein for lightwave generation and propagation under lasing conditions. Layers 19, 36 and 56 together with lower cladding layers 17, 34 and 54 and first upper cladding layers 21, 38 and 58 are light guiding layers forming the light guiding region. Additional layers with which lightwaves may interact, such as substrates 15, 32 and 52, second upper cladding layers 23, 40 and 60, and layers forming the layered waveguide structures noted above may also form part of the light guiding region.

It will, of course, be recognized that the conductivity type of the layers may be reversed from those noted above. Likewise, instead of GaAs and GaAlAs, other light emitting semiconductor materials, such as GaAsSb, InP, InGaAsP, other Group III-V compounds, Group II-VI compounds and Group IV-VI compounds, may be used, so long as two or more regions of differing effective indices of refraction may be fabricated. Moreover, the dimensions, doping levels, compositions and dopants mentioned above are exemplary only.

Lasers 10, 30 and 50 are provided with conductive contact layers 27 and 29, 44 and 46, and 64 and 66 respectively. Conductive contact layers provide a metallization for electrode connection for forward biasing of the lasers and current injection whereby light is generated in the active regions of layers 19, 36 and 56. Contact layers 27, 44 and 64 are deposited on substrates 15, 32 and 52 respectively and are typically composed of Au/Ge alloy. Contact layers 29, 46 and 66 are deposited on cap layers 25, 42 and 62 respectively and are typically composed of Ti/Pt/Au alloy.

Although FIG. 1 shows a broad area laser, lasers 10, 30 and 50 may also be single stripe gain and real refractive index guided lasers as well as phase locked laser arrays. In the later cases, the lasers 10, 30 and 50 may have one or more adjacent laterally spaced apart waveguides. Lateral waveguide structures known in the art which may be used include but are not limited to buried heterostructures, channeled-substrate-planar waveguides, mesa-substrate index guides, impurity induced disordering waveguides, ridge waveguides, rib waveguides, multiple oxide stripe gain guides, and gain guides utilizing a light absorbing current barrier layer with selectively etched gaps therein. Phase-locked laser arrays are discussed further below with reference to FIGS. 13 and 14.

The present invention provides optical elements, that is lenses and the like, within the semiconductor body of a laser by introducing a change in the effective indices of refraction in one of the semiconductor layers with which light propagating in the lasers interact. One way to obtain this refractive index change is by making use of the refractive index difference between the active region and transparent window regions. Referring to FIGS. 1-3, laser 10 has a pair of transparent window regions 70 and 72 and an active region 78 with boundaries between them indicated by dashed lines 74 and 76. Window regions 70 and 72 are characterized by a first effective index of refraction. While active region 78 is characterized by a second effective index of refraction which is different from, typically higher than, the first effective index of refraction of the windows. The boundaries 74 and 76 between respective window regions 70 and 72 and active region 78 are curved instead of planar so as to produce a biconcavely shaped active region 78. Because of the refractive index changes at boundaries 74 and 76, active region 78 forms a diverging lens for lightwaves propagating in the cavity defined between reflective facets 80 and 82. Other shapes for active region 78, such as plano-concave, biconvex, plano-convex and meniscus shapes result in other diverging and converging lenses integrated within the laser optical cavity. In general, what is necessary is a boundary between two regions of different indices of refraction having a lateral geometric contour so as to alter the phase front of lightwaves propagating in the laser cavity. Such lens structures allow for control of the laser beam shape, leading to well controlled radiating beams emanating from the laser. For example, the use of a diverging lens within the laser will allow the laser to operate as an "unstable resonator", leading to high output power with good coherence across the lateral wavefront. That is, the diverging lens will counteract the normal self-focussing which can lead to filamentation and lateral incoherence in broad area lasers. Alternatively, the refractive index boundaries may define a pair of lenses forming a beam expander. One of the lenses, formed by one or more boundaries, may be a converging lens while the other of the lenses, again formed by one or more boundaries, may be a diverging lens to recollimate the light focussed by the converging lens. A narrow beam spot is produced at the facet closest to the diverging lens, while a wider beam spot is produced at the facet closest to the converging lens.

Window regions 70 and 72 may be defined in several ways. In FIGS. 1-3, for example, the first upper cladding layer 21 has a longitudinal thickness variation. Typically, cladding layer 21 is about 0.5 $\mu$m thick in active region 78 and in a range from 0.0 $\mu$m, i.e. completely absent, to 0.25 $\mu$m thick in window regions 70 and 72. Cladding layer 21 may also have lateral thickness variations in active region 78 to form waveguides. To produce the longitudinal thickness variations, layers 17, 19 and 21 are first grown on substrate 15 using one of the known crystal growth processes mentioned above. Layer 21 is typically grown to a thickness of about 0.5 $\mu$m. A 0.05 $\mu$m GaAs layer may be deposited on layer 21 to passivate the surface. Next the wafer is removed from the growth chamber and a window pattern, such as those seen in FIGS. 2 and 6-15, is developed lithographically in a photoresist layer deposited over the passivation layer. After pattern definition, the wafer is etched in a standard etchant solution to a depth of from 0.25 $\mu$m to 0.5 $\mu$m. Typical etch rates for etchant solution used is 0.4 $\mu$m/min., resulting in etch times of approximately 30 to 75 seconds. After etching, the photoresist layer is stripped off with a solvent, such as acetone, and the wafer is etched again in the same etch solution for 10 seconds to remove the GaAs passivation layer and to produce a clean surface for crystal growth. The wafer is then reintroduced to the growth chamber where layers 23 and 25 are grown. Layer 23 fills in the etched away areas of layer 21, and since it is composed of a higher bandgap, lower refractive index material, the effective bandgap is increased to produce transparent window regions 70 and 72 with effectively lower refractive index. Alternatively, the refractive index change at the boundary can be formed by simply not regrowing, but instead leaving an air-semiconductor boundary.

Figure 4:
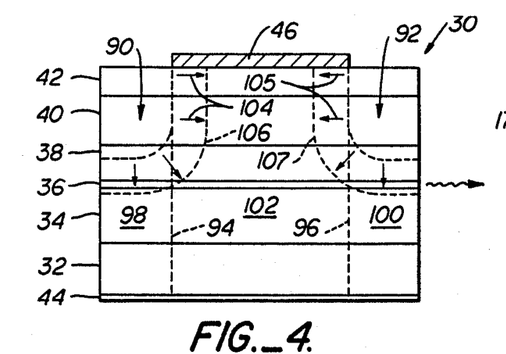
FIGS. 4 and 5 are side sections similar to FIG. 3 illustrating alternative constructions of window regions in a laser of the present invention.

An alternative method of defining window regions is seen in FIG. 4. A substrate 32 is formed and a plurality of semiconductor layers 34, 36, 38, 40 and 42 are deposited on substrate 32. A disorder inducing impurity, such as silicon, zinc or tin, is implanted into the top layers 42, 40, 38 and possibly also layer 36, forming implants 90 and 92, shown in phantom. For example, silicon may be implanted at an energy of about 80 keV, with a mask, located where conductive contact 46 is seen, shielding those regions of the laser to be active regions. By varying the implantation dose, which typically ranges from $10^{14}$ to $10^{16}$ silicon atoms per cubic centimeter, the index of refraction and effective bandgap of portions of the heterostructure can be varied with a subsequent thermal diffusion process as desired to form window regions 98 and 100 with boundaries between the window regions 98 and 100 and an active region 102 being indicated by dashed lines 94 and 96 respectively. In this method, the resulting boundaries 94 and 96 are well defined by the mask. This process is known as impurity induced disordering. Several techniques for this process are known, and any of them may be utilized. Impurities, themselves, may also be used to create a refractive index change at a boundary. Such a device may be formed as described by Isshiki et al. in the Journal of Lightwave Technology, vol. LT-4, no. 10, October, 1986, pp. 1475-1481. Alternatively, a change in injected change density within spatially defined portions of the active region may give rise to a refractive index boundary.

If desired, the transparency of window regions 98 and 100 can be improved by this process of impurity induced disordering in which the implanted impurity just described is diffused through the layer or layers 36 defining the active region. Such diffusion may be produced by annealing the implanted semiconductor wafer at elevated temperatures for a predetermined period of time. For example, in one experiment silicon was implanted at an energy of 80 keV, capped with a layer of $Si_3N_4$, and annealed for one hour at 850° C. A difference in the implantation dose produces a difference in the depth of silicon diffusion, and consequently a difference in the disordering depth, and results in a difference in the effective bandgap and index of refraction. In the experiment, the disordering depths for implantation doses of $7\times10^{14}$ cm$^{-3}$, $3\times10^{15}$ cm$^{-3}$ and $1\times10^{16}$ cm$^{-3}$ were 0.35 $\mu$m, 0.75 $\mu$m and 0.9 $\mu$m respectively. For an annealing time of two hours, the disordering depths were 0.75 $\mu$m, 0.85 $\mu$m and 1.2 $\mu$m respectively. In FIG. 4, the diffusion of the impurity in implants 90 and 92 is indicated by arrows 104 and 105 respectively. It is believed that as the impurity diffuses it drags aluminum atoms in the GaAlAs cladding layer 38 with it across the active-region-defining layer 36, thereby increasing the bandgap in portions of layer 36 delimited by dashed lines 106 and 107.

Figure 5:
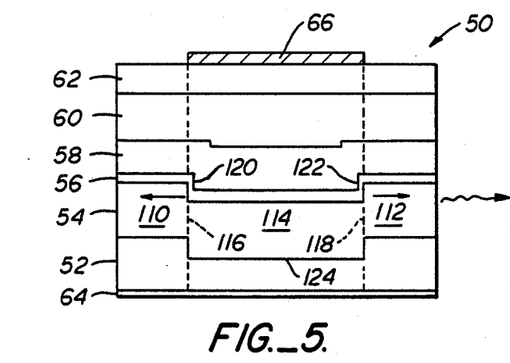

With reference to FIG. 5, another method of defining window regions 110 and 112 is to introduce steps 120 and 122 into the layer or layers 56 defining active region 114. A channel 124 is etched into substrate 52 prior to crystal growth. Typically, channel 124 is between 0.5 $\mu$m and 1.0 $\mu$m deep. After etching, the semiconductor layers 54, 56, 58, 60 and 62 are grown on substrate 52. Steps 120 and 122 are produced in layer 56 which correspond to the edges of substrate channel 124. Lightwaves are produced in active region 114 in and around layer 56. These lightwaves propagate longitudinally until they encounter steps 120 and 122. The lightwaves then leave layer 56 and propagate in window regions 110 and 112 in the higher bandgap material of cladding layer 54. Alternatively, substrate 52 may have a mesa instead of channel 124, again producing steps in layer 56. Lightwaves generated in layer 56 would then propagate in the higher bandgap material of cladding layer 58 in window regions 110 and 112.

Figure 6:
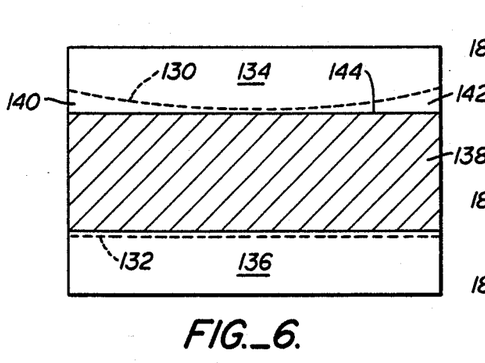
FIGS. 6–12 and 15 are top plans of alternate embodiments of a laser of the present invention.

In FIG. 2, the boundaries 74 and 76 between active region 29 and window regions 70 and 72 is curved to produce a divergent lens effect. The divergent lens causes the optical cavity, defined between cleaved end facets 80 and 82 to be unstable along the plane of the layer 19 in FIG. 1. This unstable configuration has the advantage of a large mode volume, and accordingly higher output power. The entire lens portion 29, however, need not be active. In FIG. 6, boundaries 130 and 132 are defined between respective window regions 134 and 136 and active region 138, absorbing region 140 and absorbing region 142. Active region 138 is defined by the presence of a conductive contact stripe for injecting current. Absorbing regions 140 and 142 have substantially the same effective bandgap and index of refraction as active region 138 but are not pumped by current from a conductive contact stripe. Accordingly, the interface 144 between active region 138 and absorbing regions 140 and 142 are characterized by negligible reflection and refraction. The configuration in FIG. 6 enhances lateral mode stability in broad area lasers, single stripe lasers and phase locked laser arrays because the thicker unpumped absorbing portions 140 and 142 along the edge of the lens region enhance operation of the lowest order mode.

Figure 7:
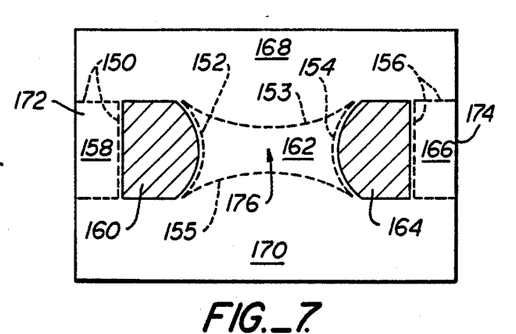

With reference to FIG. 7, a resonant optical cavity for broad area lasers and phase-locked laser arrays is defined between reflective end facets 172 and 174 characterized by a high degree of lateral mode control. The cavity includes active regions 160 and 164 defined by conductive contact stripes, unpumped absorptive regions 168 and 170, and transparent window regions 158, 162 and 166. Boundaries 150 and 152-156 are defined between the window regions 158, 162 and 166 and the absorbing and active regions 160, 164, 168 and 170. Regions 160 and 164 have a higher effective index of refraction than region 162 and the boundaries 152 and 154 are curved to produce a lateral geometric contour of refractive index changes thereby causing a change in shape of phase fronts of lightwaves propagating across boundaries 152 and 154 in the cavity. Thus, regions 160 and 164 form a pair of convergent lenses. Lenses 160 and 164 typically are spaced apart by a distance equal to the sum of their focal lengths. The boundaries 150 and 156 between regions 160 and 164 and respective window regions 158 and 166 are planar and the lenses thereby collimate the light for normal incidence at the facets 172 and 174.

Window 162 is shaped to introduce mode control within the laser of FIG. 7. Absorbing regions 168 and 170 bound window region 162 thereby defining an aperture 176 in window region 162 for lightwave propagation. The aperture 176 is transparent in window region 162, where light is most intense, and absorbing outside window region 162 to discriminate against higher order modes. Absorption by regions 168 and 170 may be redundant if the pair of active region lenses 160 and 164 suffice to focus the fundamental mode. Because the lenses are integrated within the laser cavity, small differences in modal threshold suffice for mode selection.

There are a large number of more complex lens-aperture systems which can be integrated into the laser to achieve mode control and the embodiment in FIG. 7 is exemplary only.

Figure 8:
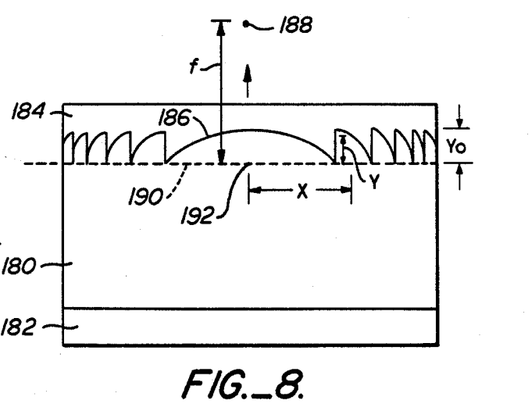
Figure 9:
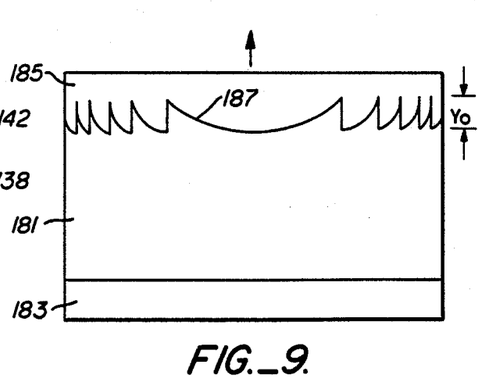

With reference to FIGS. 8 and 9, convergent and divergent Fresnel lenses are formed with these lasers. Lenses 180 and 181 may be all or partially formed by active regions, with the remaining portions being absorptive regions. Boundaries 186 and 187 between regions 182-185 of a first refractive index and lens regions 180 and 181 of a second refractive index are shaped to produce a lateral geometric contour of refractive index changes. First index regions 182-185 may be transparent window regions, lens regions 180 and 181 may be associated with the active region. The shape of boundaries 186 and 187 is such as to cause a predetermined change in the shape of a phase front for lightwaves crossing these boundaries. For example, in FIG. 8, it is desired to cause lightwaves to converge toward a focal point 188 at a distance f from a reference plane indicated by dashed line 190. At a distance x laterally from the center 192 of the laser, the boundary 186 extends a distance y from reference plane 190 satisfying the equation $$y(x,f) = my_0 \pm \frac{Y_o}{\lambda_o} [(x^2 + f^2)^{\frac{1}{2}} - f],$$

where m is an integer, $\lambda_o$ is the wavelength of the lightwaves in a vacuum, and where $y_o = \lambda/(n_2 n_1)$, $\lambda$ being the wavelength of the lightwaves in a lens region 180 or 181 of index $n_2$, and $n_1$ being the index of refraction of the first index regions 182-185. This assumes that the length of first index regions make up only a small fraction for converging lens 180 and negative for diverging lens 181.

Figure 10:
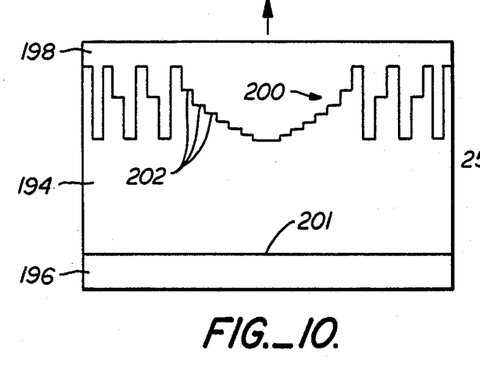

In FIG. 10, stripes of differing length produce stepped phase changes which act to focus or diverge the individual beam elements of a laser array as in a Fresnel lens. An active region 194 is defined by conductive contact stripes of varying length. The boundary 200 between a window region 198 and active region 194 is composed of a plurality of stripe end portions 202. The positions of these stripe end portions 202 is defined by the same equation above for the Fresnel lenses in FIGS. 8 and 9. Another boundary 201 between a window portion 196 and active region 194 is planar, but may also be shaped like boundary 200, if desired.

Figure 11:
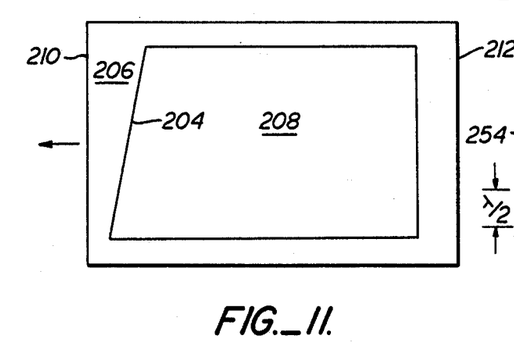

In FIG. 11, a boundary 204 between a window region 206 and an active region 208 is planar but oriented askew, i.e. not parallel, relative to cleaved end facet 210. Thus, active region 208 defines a prism. Prisms may be used alone or in combination with other prisms and other optical elements to deflect the beam, causing beam expansion or creating or compensating for astigmatism of light propagated in the laser cavity defined between cleaved end facets 210 and 212. Prisms may also be used to introduce an asymmetry in phased array lasers to favor a single lobed far field radiation profile.

Figure 12:
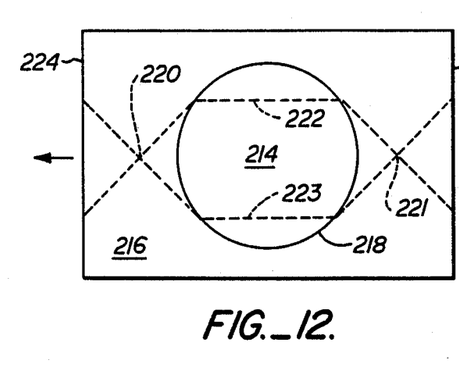

In FIG. 12, a high index of refraction region 214 forms a highly convergent lens. The circular boundary 218 between the high index region 214 and a lower index region 216 causes the light paths, such as paths 222 and 223, to bend and focus at focal points 220 and 221 at or between the reflective end facets 224 and 226. This results in an unstable resonant cavity configuration for high power output. The high index region 214 may be associated with an active region of the laser, while the lower index region 216 may be a window region. Alternatively, the unstable resonator configuration may be created by a diverging lens, such as that shown in FIG. 1. of the total focal length f. The sign is positive In FIG. 15, an etalon or Fabry-Perot resonator 228 is integrated within a semiconductor laser. Etalon 228 is characterized by a higher index of refraction than neighboring window regions 234 and 236. Etalons are constructed in the same manner as window regions and have a higher bandgap than active region 238. The boundaries 230 and 232 between etalon 228 and window regions 234 and 236 are partially reflective to lightwaves propagating across them. The etalon may be used alone or in combination with other optical elements to give added longitudinal mode selectivity and stability.

Figure 13:
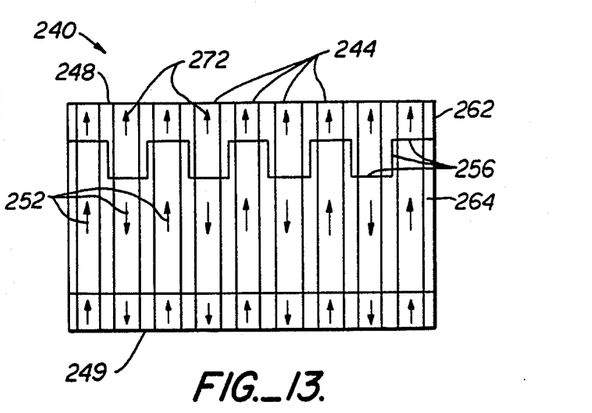
FIGS. 13–14 are top plans of laser arrays of the present invention.
Figure 14:
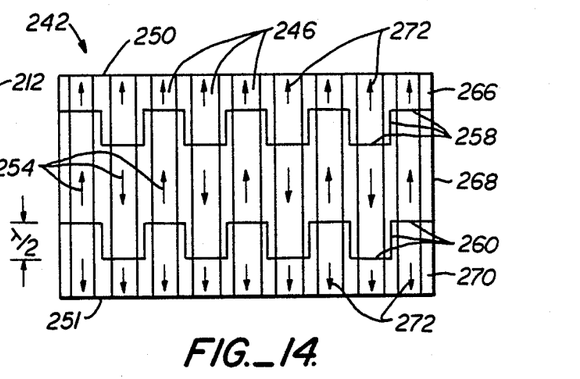
Figure 15:
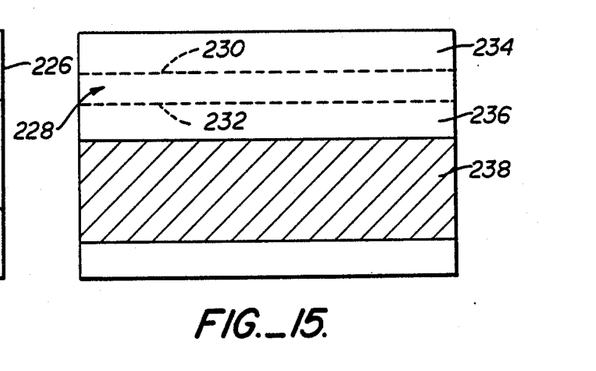

With reference to FIGS. 13 and 14, laser arrays 240 and 242 have a plurality of generally parallel laterally spaced apart waveguides 244 and 246 for guiding lightwaves propagating under lasing conditions in a resonant optical cavity defined between end facets 248-251. Waveguides 244 and 246 form laser light emitters at one or both of the facets from where a plurality of beam elements are radiated. The number of waveguides may range from a few to several thousand or more and the beams are preferably radiated in phase with one another so as to form a diffraction limited single lobe far field pattern. Usually, however, lightwaves tend to propagate 180 degrees out of phase from lightwaves in adjacent waveguides, as indicated by arrows 252 and 254 pointing in alternating directions. Though actual physical lateral waveguide boundaries are shown in FIGS. 13 and 14, depending on the lateral waveguide structures that are used, these boundaries may not be present.

Boundaries 256, 258 and 260 are defined with a periodic stepped shape between first refractive index regions 262, 266 and 270, such as transparent window regions, and second refractive index regions 264 and 268, which may be associated with an active gain region. The alternating lengths of the first refractive index regions 262, 266 and 270 due to the stepped shape is such as to produce a 180 degree phase shift in the lightwaves propagating in a first set of waveguides relative to lightwaves propagating in a second set of waveguides alternating with the first. This is indicated by the reversal in direction of arrows 272. The laser light is thus emitted in phase. The difference in stripe lengths $\Delta l$ is chosen such that the product of the equivalent refractive index difference $\Delta n_{eg}$ between the second refractive index regions 264 and 268 and the first refractive index regions 262, 266 and 270 with $\Delta l$ satisfies $$\frac{2\pi}{\lambda} \Delta n_{eg} \Delta l = p\pi,$$

where p = 1, 2, 3, ... and $\lambda$ is the wavelength of light propagating in the active region. In FIG. 13, only one boundary 256 is stepped to produce in-phase output at facet 248, while in FIG. 14, both boundaries 258 and 260 are stepped to produce in-phase output at both facets 250 and 251.

The present invention produces semiconductor lasers and laser arrays with integrated optical elements, thereby enabling lasers to be built with high power output, lateral and longitudinal mode sensitivity and selectivity and stable controlled radiation patterns without deterioration of desired laser characteristics such as gain, beam stability and current thresholds. It will be recognized that while the various elements have been described singly, lasers with combinations of the elements can be made giving a wide freedom in producing lasers with desired characteristics.

We claim:

1. A semiconductor laser having at least one optical element integrated therein comprising, a plurality of contiguous semiconductor layers on a substrate, the layers and substrate forming a semiconductor body, pumped portions of at least one of said layers forming an active region for lightwave generation, means for injecting current into said active region to produce said lightwaves, means for obtaining optical feedback of said lightwaves to achieve lasing operation, said feedback means defining a resonant cavity in the semiconductor body, and means within the semiconductor body for optical waveguiding of said lightwaves, said optical waveguiding means having one or more boundaries within the semiconductor body with which said lightwaves interact, the boundaries being characterized by a refractive index change thereat, at least portions of said boundaries being characterized by a lateral geometric contour corresponding to a surface of a selected optical element so as to cause a change in shape of phase fronts of lightwaves propagating across said boundary portions in a manner analogous to the change produced by said optical element, at least one of said boundaries being not parallel to said feedback means.

2. The laser of claim 1 wherein said boundaries are defined between said active region and unpumped transparent window regions within said semiconductor body.

3. The laser of claim 1 wherein said boundaries are defined by change in thickness at said boundaries in one of said layers with which propagating lightwaves interact.

4. The laser of claim 1 wherein said boundaries are defined by a step at said boundaries in said layers which form said active region.

5. The laser of claim 1 wherein said boundaries are defined by an impurity implant in said layers.

6. The laser of claim 1 wherein said boundaries are defined by an impurity diffused across at least one of said layers comprising said optical waveguiding means.

7. The laser of claim 6 wherein said impurity is selected from the group consisting of silicon, zinc and tin.

8. The laser of claim 1 wherein said refractive index change at said boundaries is defined by impurity induced disordering of said lasers comprising said optical waveguide means.

9. The laser of claim 1 wherein said boundaries are defined by refractive index changes in said active region.

10. The laser of claim 1 wherein said boundaries are defined by refractive index changes in a semiconductor layer bounding said active region.

11. The laser of claim 1 wherein at least one of said boundaries is curved, forming at least one optical lens in said semiconductor body.

12. The laser of claim 11 wherein said lens is a diverging lens.

13. The laser of claim 11 wherein said lens is a converging lens.

14. The laser of claim 1 wherein said boundaries define a pair of lenses forming a beam expander, one of said lenses being a converging lens, the other of said lenses being a diverging lens.

15. The laser of claim 1 wherein said active region forms a pair of spaced apart plano-convex lenses, a pair of transparent window regions being defined between reflective end facets defining said cavity and planar boundaries with said lenses, a third window region being defined between curved boundaries with said lenses, absorbing regions bounding at least said third window region so as to define an aperture in said third window region for lightwave propagation.

16. The laser of claim 1 wherein one said boundary portion has a shape so as to define a Fresnel lens.

17. The laser of claim 16 wherein said boundary portion defines a converging Fresnel lens.

18. The laser of claim 17 wherein said boundary portion defines a diverging Fresnel lens.

19. The laser of claim 1 wherein one said boundary portion is a plane with no transverse directional component oriented at an acute angle relative to a reflective end facet.

20. The laser of claim 1 wherein a high refractive index window region in said cavity has a rectangular shape defining an etalon.

21. The laser of claim 1 wherein a refractive index boundary has a circular cylindrical shape defining a strongly converging lens with a focus inside of said optical cavity.

22. The laser of claim 1 further comprising a plurality of laterally spaced apart waveguides.

23. The laser of claim 1 wherein said boundaries are stepped so as to produce a phase shift in adjacent lateral regions of said semiconductor body.

24. The laser of claim 23 wherein said boundary portions have a stepped shape so as to produce a phase shift of 180 degrees in alternating waveguides.

25. A semiconductor laser having at least one optical element integrated therein comprising, a plurality of contiguous semiconductor layers on a substrate, the layers and substrate forming a semiconductor body, pumped portions of at least one of said layers forming at least one active region for lightwave generation, means for injecting current into said active region to produce said lightwaves, means for obtaining optical feedback of said lightwaves to achieve lasing operation, said feedback means defining a resonant cavity in the semiconductor body, and means associated with said layers for defining a lightguiding region, said lightguiding region including said at least one active region, and one or more unpumped transparent window regions, said window regions being characterized by a first effective index of refraction, said active region being characterized by a second effective index of refraction, at least one boundary being defined between the window regions and said at least one active region, said at least one boundary being characterized by a lateral geometric contour corresponding to a surface of a selected optical element, at least one boundary being not parallel to said feedback means, the boundary thereby altering the shape of phase fronts of said lightwaves propagating across the boundary in a manner analogous to said optical element.

26. The semiconductor laser of claim 25 wherein said window regions are defined by a difference in thickness between one of said light guiding layers associated with said window region and said light guiding layer in said active region.

27. The semiconductor laser of claim 25 wherein said boundary between said window regions and said active region is defined by a step at said boundary in said at least one layer forming said active region.

28. The semiconductor laser of claim 25 wherein said window regions are defined by an impurity implanted in portions of said semiconductor layers.

29. The semiconductor laser of claim 25 wherein said window regions are defined by an impurity diffused across at least one of said layers comprising said light guiding region.

30. The semiconductor laser of claim 25 wherein said window regions are defined by impurity induced disordering.

31. The semiconductor laser of claim 26 wherein said at least one boundary is curved so as to form at least one lens.

32. The semiconductor laser of claim 31 wherein said lens is a diverging lens.

33. The semiconductor laser of claim 31 wherein said lens is a converging lens.

34. The semiconductor laser of claim 25 wherein said optical feedback means together with at least one optical element form an unstable optical resonator laser cavity.

35. The semiconductor laser of claim 25 wherein said boundaries define a pair of lenses forming a beam expander in said semiconductor body, one of said lenses being a converging lens, the other of said lenses being a diverging lens.

36. The laser of claim 25 wherein said active region forms a pair of spaced apart plano-convex lenses, a pair of transparent window regions being defined between reflective and facets defining said cavity and planar boundaries with said lenses, a third window region being defined between curved boundaries with said lenses, absorbing regions bounding at least said third window region so as to define an aperture in said third window region for lightwave propagation.

37. The laser of claim 25 wherein one said boundary portion has a shape so as to define a Fresnel lens.

38. The laser of claim 37 wherein said boundary portion defines a converging Fresnel lens.

39. The laser of claim 37 wherein said boundary portion defines a diverging Fresnel lens.

40. The laser of claim 25 wherein one said boundary portion is a plane oriented with no transverse directional component at an acute angle relative to cavity defining reflective end facets so as to form a prism in said cavity.

41. The laser of claim 25 wherein a high refractive index window region in said cavity has a rectangular shape defining an etalon.

42. The laser of claim 25 wherein a refractive index boundary has a circular cylindrical shape defining a strongly converging lens with a focus inside of said optical cavity.

43. The semiconductor laser of claim 25 wherein said boundaries are stepped so as to produce a phase shift in adjacent lateral regions of said semiconductor body.

44. The semiconductor laser of claim 25 further comprising a plurality of laterally spaced apart waveguides associated with said active region.

45. The semiconductor laser of claim 44 wherein said at least one boundary produces a phase shift in a first set of waveguides of 180 degrees relative to a second set of waveguides, said plurality of waveguides alternating between said first and second sets of waveguides.

* * * * *

UNITED STATES PATENT AND TRADEMARK OFFICE
CERTIFICATE OF CORRECTION

PATENT NO. : 4,815,084

DATED : March 21, 1989

INVENTOR(S) : Donald R. Scifres et al.

It is certified that error appears in the above-identified patent and that said Letters Patent is hereby corrected as shown below:

Column 9, line 30, "$y_o = \lambda/n_2 n_1)$," should read -- $y_o = \lambda/(n_2 - n_1)$, --.

Column 9, lines 34-35, "make up only a small fraction for converging lens 180" should read -- make up only a small fraction of the total focal length f. The sign is positive for converging lens 180 --.

Column 10, line 4, "Fig. 1. of the total focal length f. The sign is positive" should read -- Fig. 1. --.

Claim 18, column 12, line 18, "claim 17" should read -- claim 16 --.

Claim 31, column 13, line 20, "claim 26" should read -- claim 25 --.

Claim 36, column 14, line 2, "reflective and facets" should read -- reflective end facets --.

Signed and Sealed this

Seventeenth Day of April, 1990

Attest:

HARRY F. MANBECK, JR.

Attesting Officer

Commissioner of Patents and Trademarks